United States Patent [19]

Parthasarathi

[11] Patent Number: 4,551,210
[45] Date of Patent: Nov. 5, 1985

[54] DENDRITIC TREATMENT OF METALLIC SURFACES FOR IMPROVING ADHESIVE BONDING

[75] Inventor: Arvind Parthasarathi, Hamden, Conn.

[73] Assignee: Olin Corporation, New Haven, Conn.

[21] Appl. No.: 670,238

[22] Filed: Nov. 13, 1984

[51] Int. Cl.⁴ .................. C25D 5/34; C25D 5/48; C25D 17/00
[52] U.S. Cl. .................. 204/28; 204/32.1; 204/35.1; 204/207; 204/211
[58] Field of Search .................. 204/27, 28, 32.1, 35.1, 204/206, 207, 211

[56] References Cited

U.S. PATENT DOCUMENTS

| | | | |
|---|---|---|---|
| Re. 30,180 | 12/1979 | Wolski et al. | 428/601 |
| 2,461,556 | 2/1949 | Torig | 204/DIG. 7 |
| 3,220,897 | 11/1965 | Conley et al. | 428/606 |
| 3,271,287 | 9/1966 | Post | 204/28 |
| 3,293,109 | 12/1966 | Luce et al. | 428/556 |
| 3,322,656 | 5/1967 | Dahringer et al. | 204/38 A |
| 3,510,410 | 5/1970 | Rosenthal | 204/211 |
| 3,585,010 | 6/1971 | Luce et al. | 204/44 |
| 3,699,018 | 10/1972 | Carlson | 204/27 |
| 3,736,237 | 5/1973 | Kallianides | 204/28 |
| 3,857,681 | 12/1974 | Yates et al. | 204/27 |
| 3,918,926 | 11/1975 | Wolski et al. | 204/40 |
| 3,969,211 | 7/1976 | Watanabe | 204/211 |
| 4,049,481 | 9/1977 | Morisaki | 156/151 |
| 4,053,370 | 10/1977 | Yamashita et al. | 204/13 |
| 4,468,293 | 8/1984 | Polan | 204/27 |

FOREIGN PATENT DOCUMENTS

| | | | |
|---|---|---|---|
| 112145 | 3/1975 | Fed. Rep. of Germany | 204/27 |
| 1211494 | 11/1970 | United Kingdom | 204/27 |
| 2030176A | 4/1980 | United Kingdom | 204/27 |

Primary Examiner—T. M. Tufariello
Attorney, Agent, or Firm—Barry L. Kelmachter; Howard M. Cohn; Paul Weinstein

[57] ABSTRACT

The present invention relates to a treatment for improving the laminate adhesion of metal and metal alloy materials, particularly copper and copper alloy foils. The treatment comprises electrolytically forming a plurality of dendrites on a surface of the metal or metal alloy material and bonding the dendrites thereto. The dendrites are formed on and bonded to the metal or metal alloy material surface by one or more treatment anodes positioned at an angle to the material being treated and a single current source.

21 Claims, 3 Drawing Figures

DENDRITIC TREATMENT OF METALLIC SURFACES FOR IMPROVING ADHESIVE BONDING

The present invention relates to a method and apparatus for treating metal sheet, strip or foil to improve its adhesive properties. More particularly, a technique for applying a coral copper treatment to at least one surface of a copper or copper alloy material to improve its ability to adhere to a non-metallic, dielectric substrate material is described.

A major step in the production of printed circuit boards is the lamination of copper foil to a dielectric substrate such as fiberglass reinforced epoxy. After lamination of the foil to the substrate, a desired circuit pattern is masked onto the surface of the copper foil. Etching of the copper foil removes the unmasked areas of the foil, leaving behind the desired circuit pattern. With the present trend towards finer and narrower circuit lines and the use of thinner foils, good adherence of the foil to the substrate is essential.

Untreated wrought and electrodeposited foils generally exhibit poor adhesion to synthetic polymer substrate materials. As a result, considerable effort has been expended toward the development of techniques for improving the bond strength of metal foils. Most techniques in use today for improving metal foil bond strength involve the formation of at least one roughened surface on the metal foil prior to lamination. When the metal foil being used is formed from a copper base material, these treatments generally comprise the electrodeposition of a dendritic copper layer on at least one surface of the foil.

In most of these dendritic copper treatments or coral copper treatments as they are known in the art, a nodular powdery copper layer, primarily copper or copper oxide particles, is electrodeposited onto the foil surface. When deposited, these particles form random nodular clusters which increase the surface area of the foil. In some treatments, a second non-dendritic layer called a locking layer is electrodeposited over the dendritic layer. This locking layer is generally a smooth metal or metal alloy deposit which conforms to the configuration of the dendritic layer. The function of the locking layer is to reduce the powder transfer characteristics of the dendritic layer and to maintain the configuration of the dendritic surface projections intact during the subsequent lamination and circuit fabrication steps. Illustrative of these prior art treatments are those shown in U.S. Pat. Nos. 3,220,897 to Conley et al., 3,293,109 to Luce et al., 3,322,656 to Dahringer et al., 3,585,010 to Luce et al., 3,699,018 to Carlson, 3,857,681 to Yates et al., 3,918,926 to Wolski et al., 4,049,481 to Morisaki, 4,053,370 to Yamashita et al., and No. Re. 30,180 to Wolski et al., German Democratic Republic Patent Document No. 112,145 and U.K. Pat. No. 1,211,494.

Recently, a technique has been developed for applying a dendritic copper treatment to copper or copper alloy foil using a current having regularly recurring pulses. In this technique, copper dendrites are formed on at least one surface of the copper or copper alloy foil during a first portion of each pulse and are bonded to the surface during a second portion of each pulse. It has been discovered that this technique, illustrated in U.S. Pat. No. 4,468,293 to Polan et al., forms well-bonded dendritic structures that significantly improve the adhesive properties of the treated foil.

In accordance with the present invention, another technique for improving the laminate adhesion of metal or metal alloy foils that is relatively simple to perform is provided. This technique electrolytically forms and bonds a plurality of dendritic structures to a surface of a metal or metal alloy foil to be laminated to a substrate material. The foil to be treated is at least partially immersed in an electrolyte solution containing ions of the metal or metals to be electrodeposited onto the foil. The dendritic structures are formed by applying an initial current density well in excess of the limiting current density of the electrolyte solution to a surface of the foil leading to the formation of a plurality of dendritic deposits on the surface. This same surface is then exposed to lower and lower current densities until a final current density well below the limiting current density is applied to the foil surface. As the current density decreases the deposits become more and more adhesive, thus increasingly improving the bonding of the dendritic structures formed during the initial stages. This technique may be performed using a single constant current source by moving the foil opposite at least one treatment anode positioned at an angle with respect to the foil surface to be treated.

The apparatus of the present invention comprises an electrochemical cell containing a suitable electrolyte solution. The foil to be treated is electrically connected to the negative terminal of a current source and functions as the cell cathode. At least one treatment anode oriented at an angle with respect to the foil surface to be treated is mounted in the cell. It has been found that by using such an anode arrangement it is possible to take advantage of the resistance of the electrolyte solution to create dendrite forming and bonding current densities using a single current source.

The gap between the foil and the leading edge of the anode that is needed to create a desired initial dendrite forming current density may be determined from the following equation:

$$d_1 = V/(I_1 \cdot p)$$

where
  $d_1$ = the first gap;
  V = the potential across the electrodes;
  $I_1$ = a desired dendrite forming current density; and
  p = the resistance of the electrolyte solution.

The gap between the foil and the opposed or trailing edge of the anode needed to create a desired final bonding current density may be determined from the following equation:

$$d_2 = V/(I_2 \cdot p)$$

where
  $d_2$ = the second gap;
  V = the potential across the electrodes;
  $I_2$ = the desired final bonding current density; and
  p = the specific resistance of the electrolyte solution.

Accordingly, it is an object of the present invention to provide a technique for improving the laminate adhesion of metal and metal alloy materials.

It is a further object of the present invention to provide a technique as above that is relatively simple to perform and use.

It is a further object of the present invention to provide a technique as above for improving the laminate adhesion of copper and copper alloy foils to be used in electrical and electronic applications.

It is still a further object of the present invention to provide an apparatus for performing the above technique.

These and further objects and advantages will become more apparent from the following description and drawings in which like reference numerals depict like elements.

In accordance with the present invention, a technique for improving the laminate adhesion of wrought and electrodeposited materials, in particular copper and copper alloy foils, is provided. The technique described herein has the virtue of being relatively easy to perform while being effective for forming a plurality of well-bonded dendritic structures on one or more surfaces of the material being treated. These dendritic structures greatly improve the strength of the bond between the treated material and non-metallic dielectric substrate materials, such as synthetic polymer materials, to which it may be laminated.

While the present invention will be discussed in the context of treating copper and copper alloy foils for use in electrical and electronic applications, it should be recognized that it has wider applicablity. Metals and metal alloys other than copper base materials may be treated in accordance with the present technique.

As used herein, the term foils includes metal and metal alloy sheet and strip material.

Figure 1:
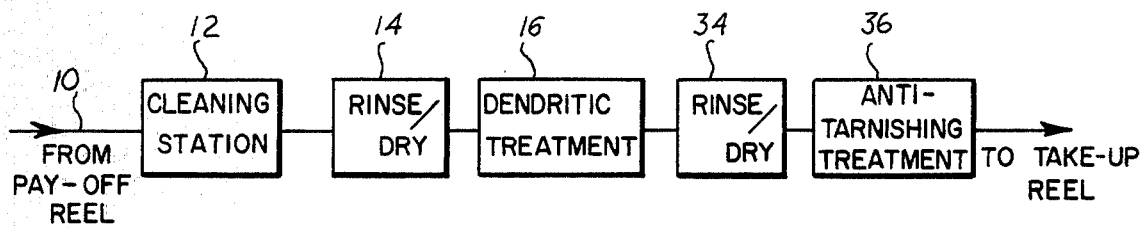
FIG. 1 is a schematic representation of a system for performing the technique of the present invention.
Figure 2:
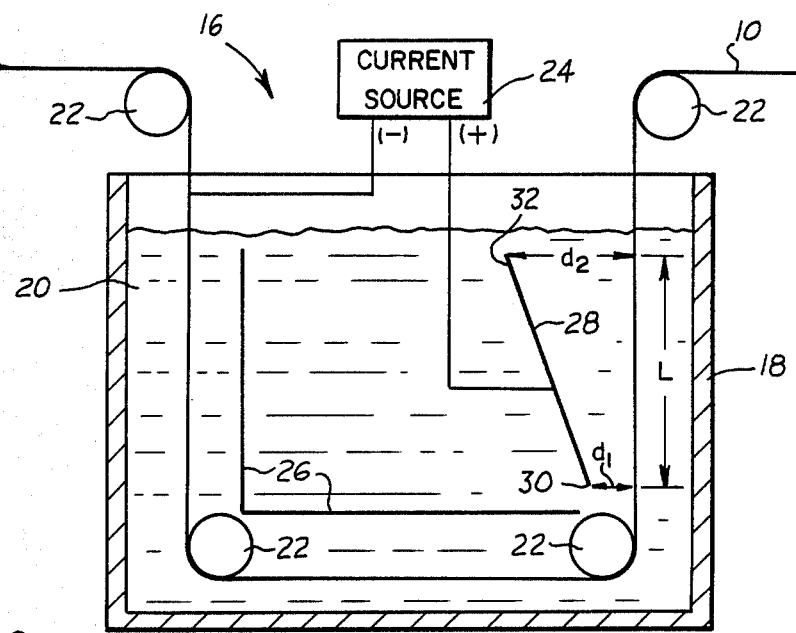
FIG. 2 illustrates an electrochemical cell for applying a dendritic treatment to a metal or metal alloy material in accordance with the present invention.

Referring now to FIGS. 1 and 2, the foil 10 to be treated is payed off a reel not shown and initially passed through a cleaning station 12. In the cleaning station, the foil is degreased and any unwanted surface contaminants such as surface oxides, scale and/or rust are removed. The cleaning station 12 may comprise any suitable cleaning apparatus known in the art. For example, cleaning station 12 may be an apparatus for electrolytically cleaning the foil, an apparatus for chemically cleaning the foil, or an apparatus for mechanically cleaning the foil. The particular type of cleaning apparatus and cleaning technique used generally depends upon the compositional nature of the foil being treated and the type of contaminants to be removed.

When treating copper base materials, satisfactory cleaning/degreasing results can be obtained by immersing the material to be cleaned in an electrolytic solution and applying a cathodic current to the material. Suitable electrolytic cleaning solutions include aqueous NaOH solutions such as a NaOH—Na$_3$PO$_4$—Na$_2$SiO$_3$—Na$_2$CO$_3$ solution or a 3% NaOH solution. Such solutions may be used either at room temperature or at a temperature above room temperature.

After cleaning, it is desirable to rinse the foil 10 to remove loose particles and wash away unwanted chemicals. After rinsing, the foil 10 may also be dried if desired. Any suitable rinsing and/or drying apparatus 14 known in the art may be used to rinse and/or dry the foil. For example, the rinsing and/or drying apparatus may comprise any suitable rinsing apparatus such as a water rinse and/or any suitable conventional drying means such as a hot air blower known in the art.

When the foil 10 being treated comprises wrought foil, it may be subjected to a treatment for rendering the surface or surfaces to be treated more electrochemically active. It has been found that such treatments greatly help to reduce the number of bare or unplated regions on the treated materials. Suitable techniques for rendering wrought foils more electrochemically active are described in allowed co-pending U.S. patent application Ser. No. 670,236 to Parthasarathi et al. and 670,239 to Parthasarathi both filed on an even date herewith.

After the foil 10 has been cleaned, rinsed, dried, and/or subjected to a surface preparation treatment, it is passed to an electrochemical cell 16 in which a plurality of dendrites are formed on and bonded to the foil material. The cell 16 comprises a tank 18 formed from a suitable material such as stainless steel or polypropylene. If desired, the tank 18 may be lined with an appropriate electrically non-conductive material not shown. The tank 18 contains an electrolyte solution 20 from which the dendritic structures are plated. The electrolyte solution 20 is preferably one in which electrical resistance varies significantly with interelectrode distance and one in which cathode polarization is low. Electrolyte solutions which satisfy both of these conditions are generally plating solutions with poor throwing power. In addition, when treating copper and copper alloy foils, it is desirable to plate copper or copper oxide dendrites onto the foil 10. It has been found that aqueous copper sulfate - sulfuric acid solutions meet the foregoing criteria and are, therefore, particularly useful as an electrolyte. Another advantage to copper sulfate-sulfuric acid solutions is that they may be used either at room temperature or at a temperature other than room temperature. When the electrolyte solution 20 is to be used at a temperature other than room temperature, the tank 18 may be provided with suitable heating/cooling means not shown for maintaining the solution 20 at the desired temperature. The heating/cooling means may comprise any suitable temperature control loop known in the art.

To obtain satisfactory dendritic plating, it is necessary for the electrolyte solution to have a high enough concentration of metal ions, e.g. copper ions, that the process may be performed efficiently. However, when using copper sulfate-sulfuric acid electrolyte solutions, the copper concentration should not be so high that the copper precipitates out as copper sulfate. Similarly, the concentration of sulfuric acid in such solutions should be at a level below that which causes the copper to precipitate out as copper sulfate. For a copper sulfate - sulfuric acid electrolyte solution at room temperature, the copper concentration should be in the range of about 5 g/l to about 60 g/l, preferably from about 10 g/l to about 40 g/l. It has been found that below a concentration of about 5 g/l the limiting current becomes too low to reasonably perform the process and that at a concentration above 60 g/l, which is about the saturation point of copper at room temperature, copper sulfate precipitates and it becomes essentially impossible to get more copper into solution. Preferably, the sulfuric acid concentration is in the range of about 10 g/l to about 100 g/l.

As previously mentioned, the copper sulfate - sulfuric acid electrolyte solution may be used at a temperature other than room temperature. The foregoing concentrations may have to be adjusted when a temperature other than room temperature is used. For example, at elevated temperatures, the solubility limit of copper increases and the concentration of copper in the electrolyte solution may be proportionately higher.

The foil 10 to be treated is at least partially immersed in the solution 20. Preferably, it is also electrically connected to the negative terminal of a power source 24. Any suitable connecting means known in the art may be used to connect the foil 10 to the source 24. The power source 24 preferably comprises a constant current source.

Suitable devices 22 such as rollers may be provided to guide the foil 10 through the solution 20 in a desired pattern. The devices 22 may be electrically insulated from the foil 10 and may be formed from either a dielectric material or a metallic material having a dielectric coating on the contacting surface. If desired, one of the devices or rollers 22 may be formed from an appropriate electrically conductive material and used to connect the foil 10 to the source 24.

In performing the present technique, it is preferred to limit the length of the foil to be subjected to the electrolytic dendrite forming treatment. To this end, an insulating barrier or shield 26 is immersed in the electrolyte solution 20. The insulating barrier may be formed from any suitable dielectric material known in the art.

To apply the desired coral copper treatment to the foil 10, at least one treatment anode 28 is placed in the cell 16 at an angle to the foil surface to be treated. This angle is preferably greater than 0° but less than 90° with respect to the foil surface. It has been found that by using such an anode arrangement it is possible to take advantage of the resistance of the electrolyte solution 20 to use a single constant current source 24 to create an initial dendrite forming current density at the leading edge 30 of each anode 28 while at the same time creating a non-dendritic plating current density at the trailing edge 32 of the anode 28 for bonding the dendrites to the foil surface.

Each treatment anode 28 may be mounted in the tank 18 in any suitable manner using any suitable mounting means known in the art. In addition, each treatment anode 28 may be formed from any suitable metal or metal alloy known in the art. For example, the anode may be formed from copper, platinum, lead and lead alloys such as a Pb-6%Sb alloy. The length of each anode 28 is determined by the corresponding length L of the foil acting as an active cathode which is in turn a function of foil speed and plating time.

The specific angle at which each treatment anode is tilted with respect to the foil 10 is a function of the interelectrode gaps, $d_1$ and $d_2$ respectively, needed at the edges 30 and 32 to produce the desired current densities. In the case of the dendrite forming treatment of the present invention, the current densities at the two edges are respectively an initial one well above the limiting current density of the electrolyte solution 20 and a final one well below the limiting current density of the solution. If these desired current densities are $I_1$ and $I_2$ respectively, then $$I_1 = V/R_1 \qquad (1)$$

where
$V$ = the potential across the electrodes; and
$R_1$ = the resistance of a horizontal column of solution of unit area at the leading edge 30 of the interelectrode gap; and $$I_2 = V/R_2 \qquad (2)$$

where
$V$ = the potential across the electrodes; and
$R_2$ = the resistance of a similar column of solution at the trailing edge 32 of the interelectrode gap.

If the specific resistance, p, of the solution is known, then $R_1 = pd_1$ and $R_2 = pd_2$. The interelectrode gaps $d_1$ and $d_2$ can then be determined as follows:

$$d_1 = R_1/p = V/(I_1 \cdot p); \qquad (3)$$

and $$d_2 = R_2/p = V/(I_2 \cdot p). \qquad (4)$$

As shown above, the tilt angle required for each treatment anode 28 may be defined based upon the specific resistance of the electrolyte solution 20, a property which can be experimentally measured. In some electrolyte solutions, there may be a variation of cathode polarization with current density. When present, this acts to reduce the effect of anode tilting. As a result, the tilting angle may have to be increased in some solutions beyond that predicted by the above solution resistance calculations.

In operation, a potential V is applied across the anode 28 and the foil/cathode 10 by the current source 24. A plurality of dendrites are plated onto the foil 10 in that region in which the applied current density exceeds the limiting current density. As the interelectrode gap increases, the applied current density decreases. When the interelectrode gap becomes sufficiently large to drop the applied current density below the limiting current density, more adherent, non-dendritic copper deposits are plated onto the foil 10 over the dendrites. Eventually, a layer of non-dendritic copper deposits is formed which acts to bond the dendrites to the foil 10. By thus providing a continually decreasing applied current density, a rough but tenacious dendritic layer can be obtained.

After the dendrite forming and bonding treatment has been completed, the treated foil may be rinsed to remove loose particles and wash away unwanted chemicals and contaminants. Prior to being wound upon a take-up reel not shown, the foil 10 is also dried. Any suitable apparatus 34 known in the art may be used to rinse and/or dry the treated foil. For example, apparatus 34 may comprise a water rinse and/or a hot air blower.

Where needed, the treated foil may be subjected to an anti-tarnishing treatment either before or after being rinsed and/or dried. Any suitable anti-tarnishing treatment and apparatus 36 known in the art may be used. For example, the treated foil may be immersed in a chromic acid solution.

After the dendritic treatment and/or anti-tarnishing treatment has been completed, he treated foil may be laminated to a substrate material using any suitable lamination technique known in the art. The treatment of the present invention has particular utility in treating metal or metal alloy materials to be laminated to synthetic polymer substrates such as polyimides and resinous substrate materials. It has been found that the dendritic structures formed on the metal or metal alloys by the present technique act as anchors which improve the mechanical bond and consequently the bond strength between the treated material and the substrate.

To demonstrate the present invention, the following example was performed:

EXAMPLE

A 2 oz./ft$^2$ copper alloy C11000 foil sample was immersed in a copper sulfate—sulfuric acid solution at room temperature. The solution contained a copper concentration of 20 g/l and a sulfuric acid concentration of 45 g/l. A copper anode was placed in the test cell at an angle to the foil sample. An interelectrode gap of about 1 cm. was formed at one end of the anode and an interelectrode gap of about 7 cm. was formed at the opposite end of the anode. A potential of about 0.8 volts was applied for 10 seconds. The effective plating zone was about 7.5 cm long.

Under these conditions, it was found that a first current density of about 70 mA/cm$^2$ was formed across the smallest interelectrode gap and a second current density of about 25 mA/cm$^2$ was formed across the largest interelectrode gap. The limiting current density of the copper sulfate—sulfuric acid solution was about 35 mA/cm$^2$. Thus, the first current density was well above the limiting current density and the second current density was well below it. Dendritic plating was obtained in the region of the smallest interelectrode gap and smooth non-dendritic plating was obtained in the region of the largest interelectrode gap.

Where the solution resistance is not known, there is an alternative method for obtaining the approximate values of the gaps d$_1$ and d$_2$. In this alternative method, each treatment anode is at first kept parallel to the foil/cathode. Changes in current density at a fixed potential are then measured as a function of change in interelectrode gap. After determining the gaps needed to obtain the desired current densities, each anode may be oriented to provide the desired dendrite forming and bonding current densities at its leading and trailing edges.

Figure 3:
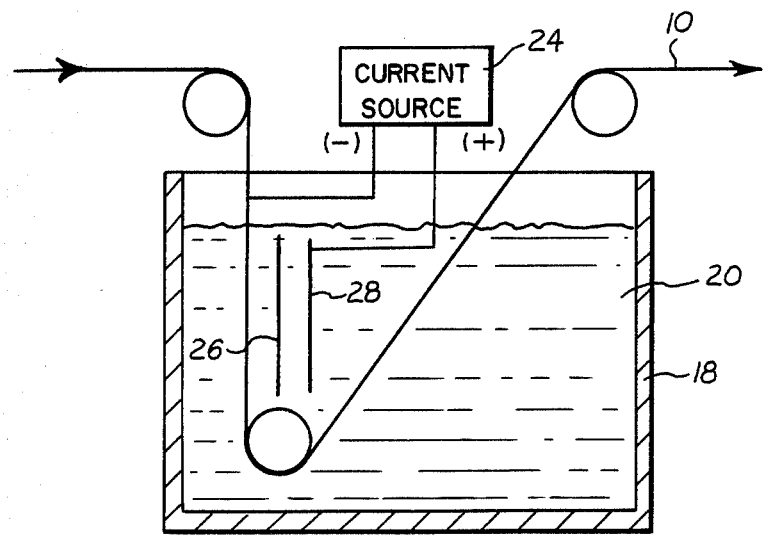
FIG. 3 illustrates an alternative embodiment of the electrochemical cell of the present invention.

While the invention has been shown as having a tilted anode, it is also possible to perform the technique of the present invention by tilting the foil relative to the anode. This variation is illustrated in FIG. 3.

It should be apparent that if one wanted to treat more than one surface of the foil, one could do so by placing a tilted treatment anode adjacent each surface to be treated. Each treatment anode could be electrically connected to the same power/current source.

The U.S. patents and patent applications and foreign patent publications set forth in this specification are intended to be incorporated by reference herein.

It is apparent that there has been provided in accordance with this invention a dendritic treatment of metallic surfaces for improving adhesive bonding which fully satisfies the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to cover all such alternatives, modifications, and variations as fall within the spirit and broad scope of the appended claims.

What is claimed is:

1. An apparatus for improving the adhesive properties of a metal or metal alloy material, said apparatus comprising:

a cell containing an electrolyte solution, said metal or metal alloy material being at least partially immersed in said solution; and means for applying a continuously decreasing current density to said material, said current density applying means comprising an anode positioned at an angle with respect to said material for applying an initial current density to said material in excess of the limiting current density of said solution to form a plurality of dendrites thereon and for applying a final current density below the limiting current density to said material to bond said dendrites to said material.

2. The apparatus of claim 1 further comprising:

a power source; and said material being electrically connected to a negative terminal of said power source, whereby said material acts as a cathode.

3. The apparatus of claim 1 further comprising:

means for shielding a portion of said material so that no plating takes place along said portion.

4. The apparatus of claim 3 wherein said shielding means comprises an electrical insulating barrier immersed in said electrolyte solution between said anode and said portion.

5. The apparatus of claim 2 further comprising:

said power source comprising a constant current source.

6. The apparatus of claim 2 wherein:

said anode forms a first interelectrode gap with said material, said first gap being defined by the equation:

$$d_1 = V/(I_1 \cdot p)$$

where d$_1$ = said first gap;
V = applied potential;
I$_1$ = said initial current density; and
p = the specific resistance of said electrolyte solution.

7. The apparatus of claim 6 wherein:

said anode further forms a second interelectrode gap greater than said first gap with said material; and said second interelectrode gap being defined by the equation:

$$d_2 = V/(I_2 \cdot p)$$

where d$_2$ = said second gap;
V = the applied potential;
I$_2$ = said final current density; and
p = said specific electrolyte solution resistance.

8. The apparatus of claim 7 further comprising:

said angle being defined by said first and second gaps and being greater than about 0° and less than about 90°.

9. The apparatus of claim 1 further comprising:

said metal or metal alloy material being a copper base material; and said electrolyte solution comprising an aqueous copper sulfate—sulfuric acid solution.

10. The apparatus of claim 1 further comprising:

means for cleaning said material prior to forming and bonding said dendrites to said material.

11. The apparatus of claim 1 further comprising:

means for applying an anti-tarnishing treatment to said material after completion of said dendrite formation and bonding.

12. The apparatus of claim 1 wherein said current density applying means comprises a plurality of anodes, each said anode being positioned at an angle with respect to said material.

13. A process for improving the adhesive properties of a metal or metal alloy material, said process comprising:
- at least partially immersing said metal or metal alloy in an electrolyte solution containing a concentration of metal to be deposited onto said material;
- positioning an anode at an angle with respect to said material; and
- applying a potential to said anode so that a continually decreasing current density having an initial value in excess of the limiting current density of said solution for forming a plurality of dendrites thereon and a final current density below the limiting current density of said solution to bond said dendrites to said material is applied to said material.

14. The process of claim 13 further comprising:
electrically connecting said material as a cathode.

15. The process of claim 14 further comprising:
electrically shielding a portion of said material to prevent plating thereon.

16. The process of claim 15 wherein said shielding step comprises:
placing an electrical insulating barrier between said portion of said material and said anode.

17. The process of claim 13 further comprising:
applying said potential with a single constant current source.

18. The process of claim 13 wherein said anode positioning step comprises:
forming a first gap between a leading edge of said anode and said material, said first gap being defined by the equation:

$$d_1 = V/(I_1 \cdot p)$$

where
$d_1$ = said first gap;
$V$ = the applied potential;
$I_1$ = said initial current density; and
$p$ = the specific resistance of said solution; and forming a second gap between a trailing edge of said anode and said material, said second gap being greater than said first gap and being defined by the equation:

$$d_2 = V/(I_2 \cdot p)$$

where
$d_2$ = said second gap;
$V$ = the applied potential;
$I_2$ = said final current density; and
$p$ = said specific solution resistance.

19. The process of claim 13 further comprising:
cleaning said material before forming said dendrites thereon.

20. The process of claim 13 further comprising:
applying an anti-tarnishing treatment to said material after said dendrites have been formed thereon and bonded thereto.

21. The product of the process of claim 13.

* * * * *